(12) United States Patent
Painchaud et al.

(10) Patent No.: US 6,292,120 B1
(45) Date of Patent: Sep. 18, 2001

(54) AUTOMATIC GAIN CONTROL FOR INPUT TO ANALOG TO DIGITAL CONVERTER

(75) Inventors: Dean Painchaud, East Hartford; Lawrence J Wachter, Oxford, both of CT (US)

(73) Assignee: ADC Telecommunications, Inc., Minneapolis, MN (US)

( * ) Notice: Subject to any disclaimer, the term of this patent is extended or adjusted under 35 U.S.C. 154(b) by 0 days.

(21) Appl. No.: 09/517,685

(22) Filed: Mar. 2, 2000

(51) Int. Cl.[7] ...................................................... H03M 1/14
(52) U.S. Cl. ............................................. 341/139; 341/155
(58) Field of Search ..................................... 341/155, 139, 341/172, 144, 120, 150, 161

(56) References Cited

U.S. PATENT DOCUMENTS 6,150,968 * 11/2000 Tsay et al. ............................ 341/139
6,204,787 * 3/2001 Baird ..................................... 341/139

OTHER PUBLICATIONS

ADC Telecommunications, "DV 6000, Intermediate Frequency (IF) Video Encoders and Decoders", pp. 1–4, Dec. 1998.

L.B. Jackson, *Digital Filters and Signal Processing*, Kulwer Academic Publishers, Boston, Chapters 6 and 11, 1986.

J.G. Proakis and D.G. Manolakis, *Digital Signal Processing*, Macmillan Publishing, Chapters 7 and 10, New York, 1992.

J. Smith, *Modern Communication Circuits*, McGraw Hill, pp. 188–198, 1986.

* cited by examiner

*Primary Examiner*—Brian Young
(74) *Attorney, Agent, or Firm*—Fogg, Slifer & Polglaze, P.A.

(57) ABSTRACT

An automatic gain control circuit for an analog to digital converter is provided. The automatic gain control circuit includes an input, coupled to an output of the analog to digital converter, to receive samples output by the analog to digital converter. The automatic gain control circuit also includes a digital to analog converter that is coupled to selectively adjust a magnitude of an input signal for the analog to digital converter. The automatic gain control circuit also includes a microcontroller. The microcontroller is coupled to the input and the digital to analog converter. The microcontroller is programmed to generate a feedback signal for the digital to analog converter to control the amplitude of the input to the analog to digital converter.

33 Claims, 6 Drawing Sheets

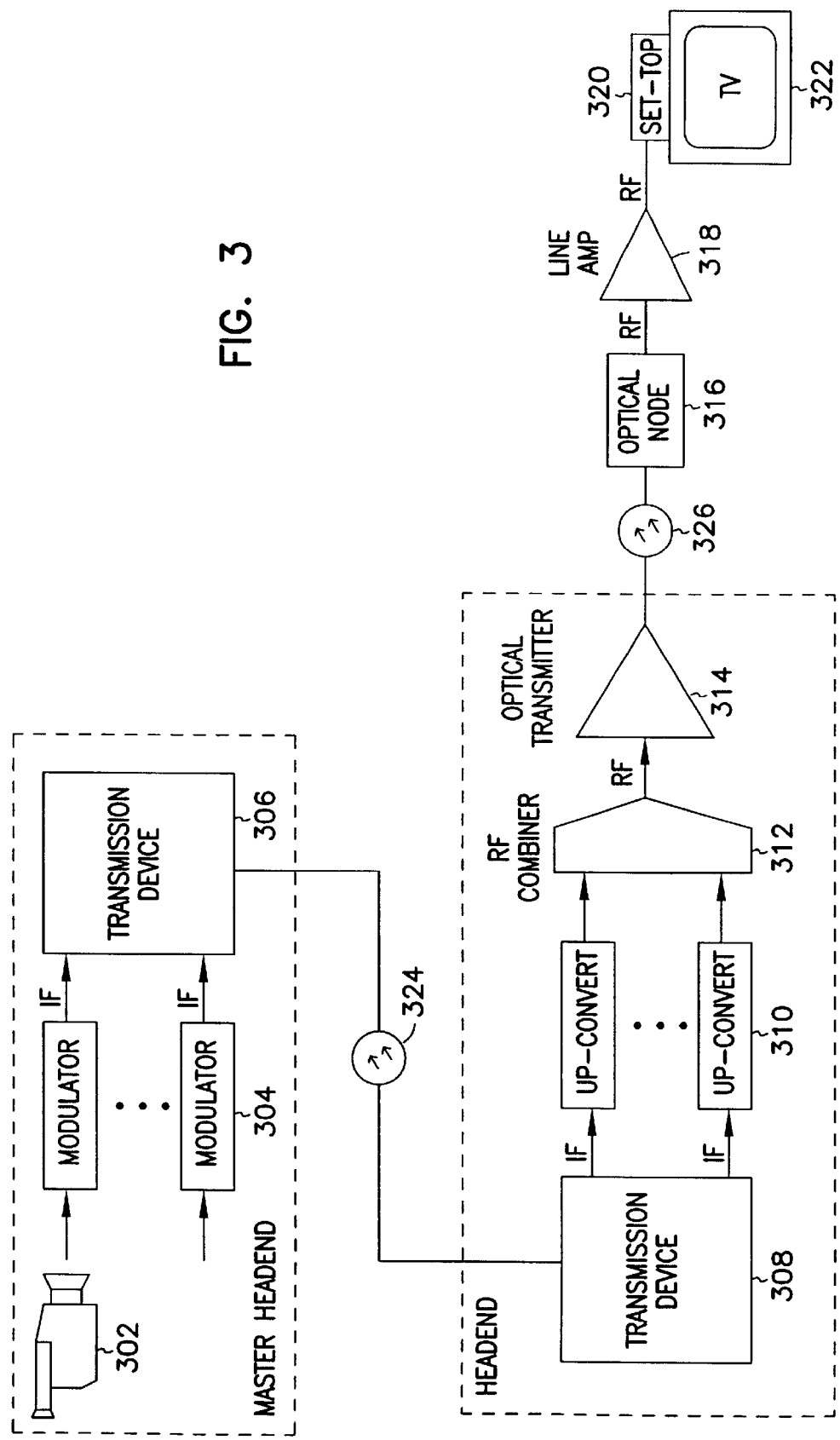

AUTOMATIC GAIN CONTROL FOR INPUT TO ANALOG TO DIGITAL CONVERTER

RELATED APPLICATIONS

This application is related to co-pending and co-filed application Ser. No. 09/517,039, filed on Mar. 2, 2000, entitled "Architecture for Intermediate Frequency Video Decoder" by inventors Dean Painchaud and Lawrence J. Wachter, which is hereby incorporated by reference. This application is further related to co-pending and co-filed application Ser. No. 09/518,072, filed on Mar. 2, 2000, entitled "Architecture for Intermediate Frequency Video Encoder" by inventors Dean Painchaud Lawrence J. Wachter, which is hereby incorporated by reference.

TECHNICAL FIELD

The present invention relates generally to the field of electronics and, in particular, to automatic gain control for an input to an analog to digital converter.

BACKGROUND

Analog to digital (A/D) converters are used in a wide variety of electronic circuits. An analog to digital converter is an electronic circuit that receives an analog input signal and produces a digital output signal. The digital output signal is produced based on samples of the analog input signal taken over time.

In some circuits, it is desirable to maintain the peak input voltage of the analog signal at or near the maximum value for the range of input signals accepted by the analog to digital converter. Thus, automatic gain control circuits have been used in conjunction with analog to digital converters. Typically, the automatic gain control circuit monitors the input to the analog to digital converter. The automatic gain control circuit further generates a feedback signal based on the monitored input signal. The feedback signal is provided to an amplifier to control the level of the input signal to the analog to digital converter. This feedback signal attempts to keep the peak voltage level of the input signal at or near the full-scale value of the input for the analog to digital converter.

Conventionally, the feedback signal is generated using analog circuitry. For example, such feedback loops typically include one or more of the following analog control blocks: a log amplifier, a summing amplifier, an integrator, and a differentiator. Unfortunately, these analog feedback control loops typically suffer from the so-called "clip" effect. This means that when the input signal exceeds the full-scale input for the analog to digital converter, the control circuitry is unable to quickly reach steady-state operation. Some control loops attempt to use digital circuitry. However, these digital control loops typically suffer from an additional problem relating to the quantization of the control word used to adjust the gain of the input signal for the A/D converter. In this situation, when the control loop reaches a steady-state, it tends to introduce an oscillation effect on the input signal to the A/D converter.

For the reasons stated above, and for other reasons stated below which will become apparent to those skilled in the art upon reading and understanding the present specification, there is a need in the art for an improved automatic gain control circuit for an analog to digital converter input.

SUMMARY

The above mentioned problems with analog to digital converters and other problems are addressed by the present invention and will be understood by reading and studying the following specification. Embodiments of the present invention use automatic gain control in a digital feedback path based on samples of the output of the analog to digital converter to create a feedback control circuit. An output of the feedback control circuit is compensated, when necessary, to account for an analog input that exceeds the full scale range of the analog to digital converter. Further, the output of the feedback control circuit is also compensated, when necessary, to set a feedback signal at a selected value to prevent oscillation due to quantization effects in the feedback path.

More particularly, in one embodiment an automatic gain control circuit for an analog to digital converter is provided. The automatic gain control circuit includes an input, coupled to an output of the analog to digital converter, to receive samples output by the analog to digital converter. The automatic gain control circuit also includes a digital to analog converter that is coupled to selectively adjust a magnitude of an input signal for the analog to digital converter. The automatic gain control circuit also includes a microcontroller. The microcontroller is coupled to the input and to the digital to analog converter. The microcontroller is programmed to generate a feedback signal for the digital to analog converter to control the amplitude of the input t digital converter.

BRIEF DESCRIPTION OF THE DRAWINGS

FIG. 3 is a block diagram that illustrates an embodiment of a system that uses automatic gain control for an analog to digital converter according to the teachings of the present invention.

DETAILED DESCRIPTION

In the following detailed description, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
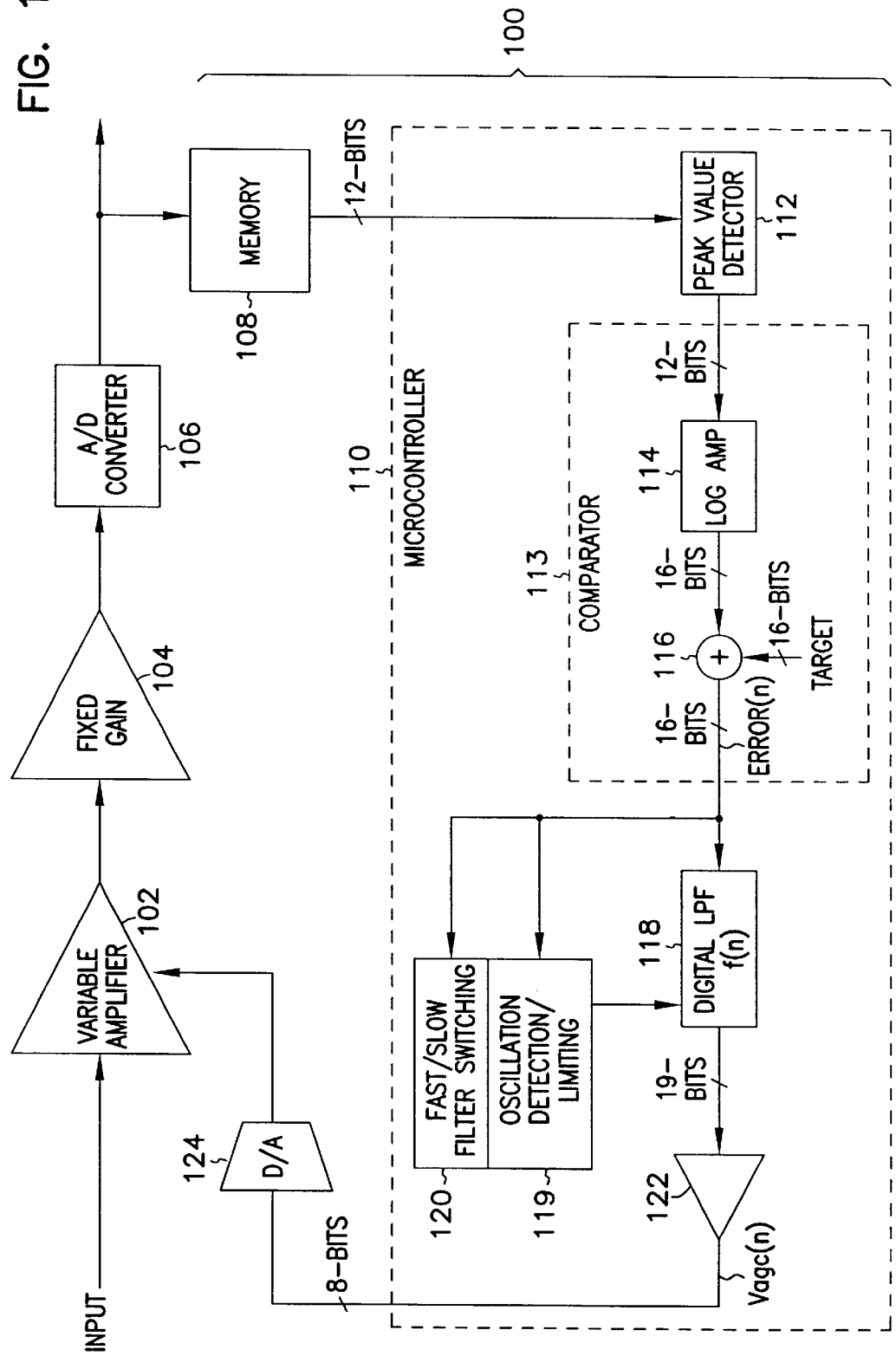
FIG. 1 is a block diagram of an illustrative embodiment of a control circuit for an analog to digital converter according to the teachings of the present invention.

FIG. 1 is a block diagram of an illustrative embodiment of a control circuit, indicated generally at 100, for analog to digital (A/D) converter 106 according to the teachings of the present invention. Control circuit 100 is illustrated as used with processing intermediate frequency, IF, signals by A/D converter 106. It is understood however that control circuit 100 is used, in other embodiments, to process other types of analog signals.

Control circuit 100 is used to control the amplitude of signals provided to A/D converter 106. In this embodiment, IF signals applied to the input of A/D converter 106 are processed by variable amplifier 102 and fixed gain amplifier/front end analog circuitry 104. Variable amplifier 102 is a voltage controlled amplifier. In other embodiments, variable amplifier 102 comprises any other appropriate amplifier with a variable gain. It is noted that the term variable amplifier includes amplifier circuits that are operable with a gain of less than 1.

A/D converter 106 includes an input that is coupled to the output of fixed gain amplifier/front end analog circuitry 104. In one embodiment, A/D converter 106 comprises a 12-bit A/D converter that produces an output signal with 12 bits per sample. In other embodiments, AID converter 106 produces output signals with a number of bits as appropriate for the application. A/D converter 106 accepts analog signals with inputs over a specified range of magnitudes or voltage levels. The maximum level acceptable without clipping is referred to as the "full-scale" input for the A/D converter. When the full-scale input level is exceeded, the output signal for the A/D converter is no longer substantially linearly related to the magnitude of the input signal. As described below, control circuit 100 is designed to detect and compensate for this condition.

Control circuit 100 includes three main components: namely, memory 108, microcontroller 110 and digital to analog (D/A) converter 124. Each of these elements is described in turn below. Basically, control circuit 100 generates a feedback signal to control the gain of variable amplifier 102 based on the digital output of A/D converter 106. The level of the feedback signal is selected to keep the relative peak or maximum value of the output of A/D converter 106 (and hence the input of A/D converter 106) at or near 95 percent of the full-scale value. In other embodiments, control circuit 100 maintains the input signal for A/D converter at a selected level acceptable for the application.

Control circuit 100 includes memory 108. Memory 108 comprises a snapshot memory that receives and stores digital samples from A/D converter 106. In one embodiment, memory 108 captures and stores a contiguous block of 256 words of 12 bit samples. In other embodiments blocks of other appropriate numbers and sizes of words are used. Memory 108 is coupled to microcontroller 110.

Microcontroller 110 processes the samples from memory 108. Specifically, in this embodiment, microcontroller 110 implements a number of functions, described below, in firmware. In other embodiments, microcontroller 110 is replaced with discrete components or other circuitry to implement the functions described using software, firmware, hardware or any other appropriate combination thereof.

Microcontroller 110 includes peak value detector 112. Peak value detector 112 is coupled to receive samples of the output of A/D converter 106 from memory 108. Peak value detector 112 determines the relative peak value of the absolute value of the samples in a block of data from memory 108. In other embodiments, more blocks of samples from memory 108 are used to produce a peak value output. Further, in other embodiments, peak values for a number of blocks are averaged to produce a peak value. In this embodiment, peak value detector 112 outputs a peak value every 50 milliseconds. Microcontroller 110 also produces a corresponding output signal every 50 milliseconds. It is noted that in other embodiments, other appropriate time periods between outputs from peak value detector 112 are used.

Peak value detector 112 provides the output value to comparator 113 for comparison with a target value. In one embodiment, comparator 113 includes log amplifier 114 and subtractor 116. Log amplifier 114 is coupled to the output of peak value detector 112. Log amplifier 114 is incorporated to linearize the control loop transfer function for microcontroller 110. Subtractor 116 receives an output from log amplifier 114 and subtracts the output from a target value. As described above, this target value is selected to place the peak input and output levels of A/D converter 106 at or near 95 percent of its full-scale value. In other embodiments, other appropriate comparator circuits are used in place of log amplifier 114 and subtractor 116.

Digital filter 118, oscillation detection/limiting circuit 119 and fast/slow filter 120 process the output of comparator 113 to produce the control signal feedback for controller 110. In one embodiment, digital filter 118 comprises a digital low pass filter with a 32-bit internal accumulator. Oscillation detection/limiting circuit 119 is coupled to the output of comparator 113 and provides input to digital filter 118. Oscillation detection/limiting circuit 119 detects when the output of comparator 113 fluctuates between two values. This oscillation effect is due to the fact that a digital word is used to control the gain in the input path for A/D converter 106. Thus, when the control signal reaches what should be a steady state, it tends to oscillate between two values since the quantization effect makes it such that neither value produces zero error with respect to the target value. In this case, oscillation detection/limiting circuit 119 sets the output of digital filter 118 at, for example, one of the two values, the current value, or any other appropriate value.

Fast/slow filter 120 is also coupled to the output of comparator 113. Fast/slow filter 120 determines when the input signal to A/D converter 106 exceeds its full-scale value. This is detected by a relatively constant, small, negative error signal from comparator 113. In this event, fast/slow filter 120 forces the output of microcontroller 110 to a selected value to compensate for this effect.

Microcontroller 110 also includes amplifier 122 that is coupled to an output of digital filter 118. Amplifier 122 scales the output of digital filter 118 for application to digital to analog converter 124. In one embodiment, digital to analog converter 124 comprises an 8-bit digital to analog converter. In other embodiments, a digital to analog converter with an appropriate number of input bits for the application is used.

In operation, control circuit 110 monitors the output of A/D converter 106 and generates a control signal to maintain the peak level of the input to A/D converter 106 at or near 95 percent of its full-scale value. Memory 108 captures and stores blocks of samples from A/D converter 106. Peak value detector 112 detects a relative peak value based on the block of data. Periodically, peak value detector 112 provides an updated output to log amplifier 114. Log amplifier 114 linearizes the control loop transfer function of microcontroller 110. Subtractor 116 compares the output of log amplifier 114 with a target value, e.g., a value related to 95 percent of the full-scale value for A/D converter 106.

The output of subtractor 116 is processed by digital filter 118, oscillation detection/limiting circuit 119 and fast/slow filter 120 to produce a control signal for variable amplifier 102. This signal is scaled by amplifier 122 and provided to digital to analog converter 124. Digital to analog converter 124 converts the digital feedback signal to an analog voltage for variable amplifier 102.

FIGS. 2A, 2B, 2C, and 2D are flowcharts of an embodiment of a process for generating a control signal that adjusts the magnitude of an input to an analog to digital converter according to the teachings of present invention. This method implements the functionality of digital filter 118, fast/slow filter 120 and oscillation detection/limiting circuit 119 of FIG. 1.

The method begins at block 202 and computes an error signal. This error signal is represented in equation 1:

$$\text{error}(n) = \text{target} - \text{snapshot}(n) \qquad \text{Equation 1}$$

In equation 1, target represents the log of the target value for the input to the A/D converter and snapshot(n) represents the log of the measured peak value for a period of time. The method uses the value for the variable error(n) to establish the feedback control signal for a control loop that adjusts the input to the A/D converter.

At block 204, the method tests to determine whether the error is due to an input signal that exceeds the full scale input level. In process, error(n) is tested to determine if it is below a threshold value (errorthresh). If so, the input to the A/D converter exceeds the full-scale input level and the method proceeds to blocks 206–216 to generate an appropriate control signal. At block 206, the method convolves the frequency response of the filter(n) with a selected constant (errormult) as represented by equation 2.

$$f_o(n) = f(n) \otimes \text{errormult} \qquad \text{Equation 2}$$

This output is multiplied by another constant, K, to produce a control signal, $V_{acg}(n)$ at block 208 as shown in equation 3.

$$V_{acg}(n) = K \times f_o(n) \qquad \text{Equation 3}$$

At block 210, the method determines whether the adjusted control signal is less than 1. If so, the method substitutes 1 for the control signal and returns to block 202. If not, the method proceeds to block 214 and determines whether the adjusted control signal is greater than 255 (the maximum value for the digital to analog converter output of the control loop). If so, the maximum value is substituted at block 216. Otherwise, the method uses the value calculated at block 208 and returns to block 202.

Figure 2A:
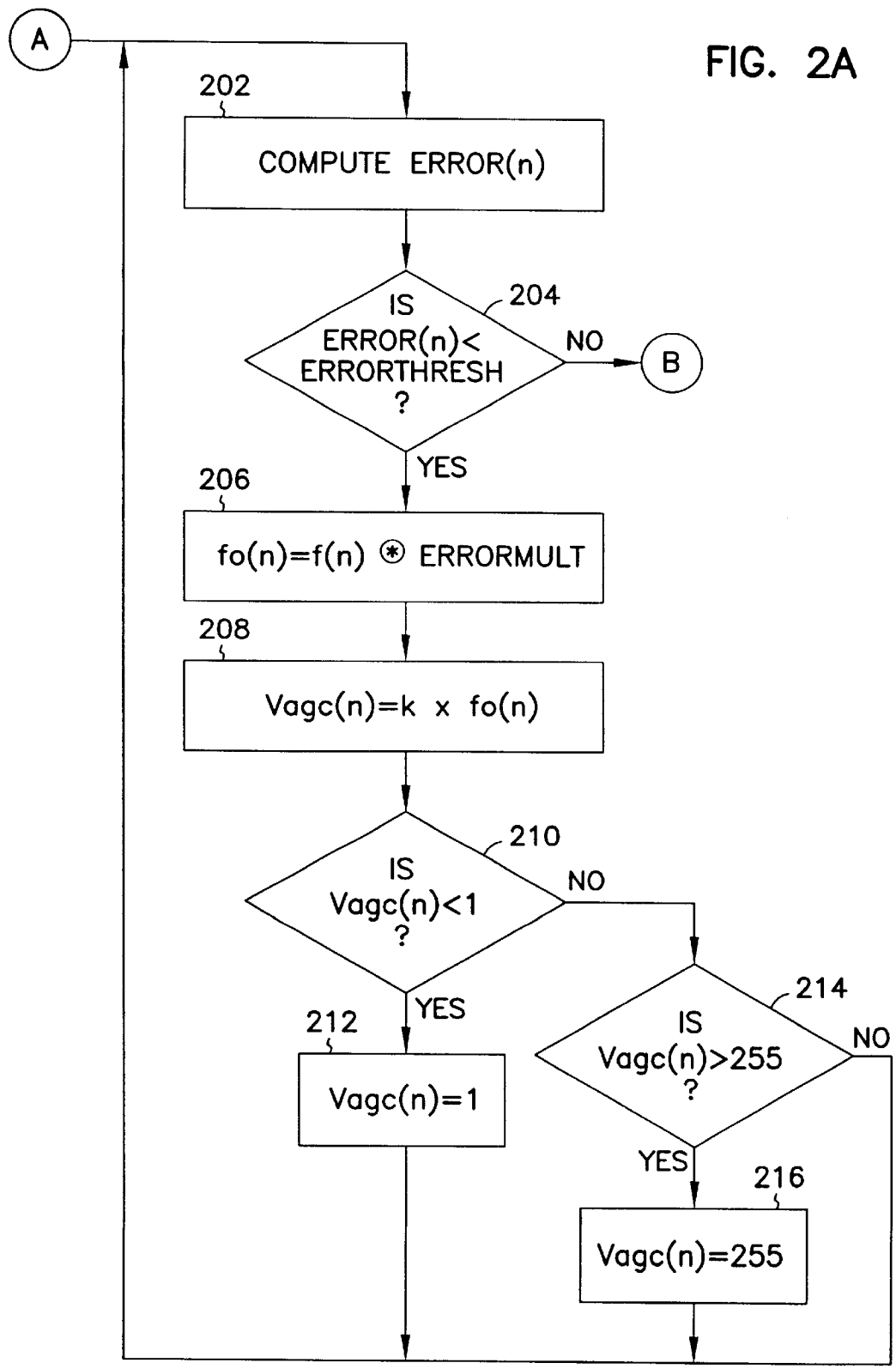
FIGS. 2A, 2B, 2C, and 2D are flowcharts of an embodiment of a process for generating a control signal that adjusts the magnitude of an input to an analog to digital converter according to the teachings of present invention.
Figure 2B:
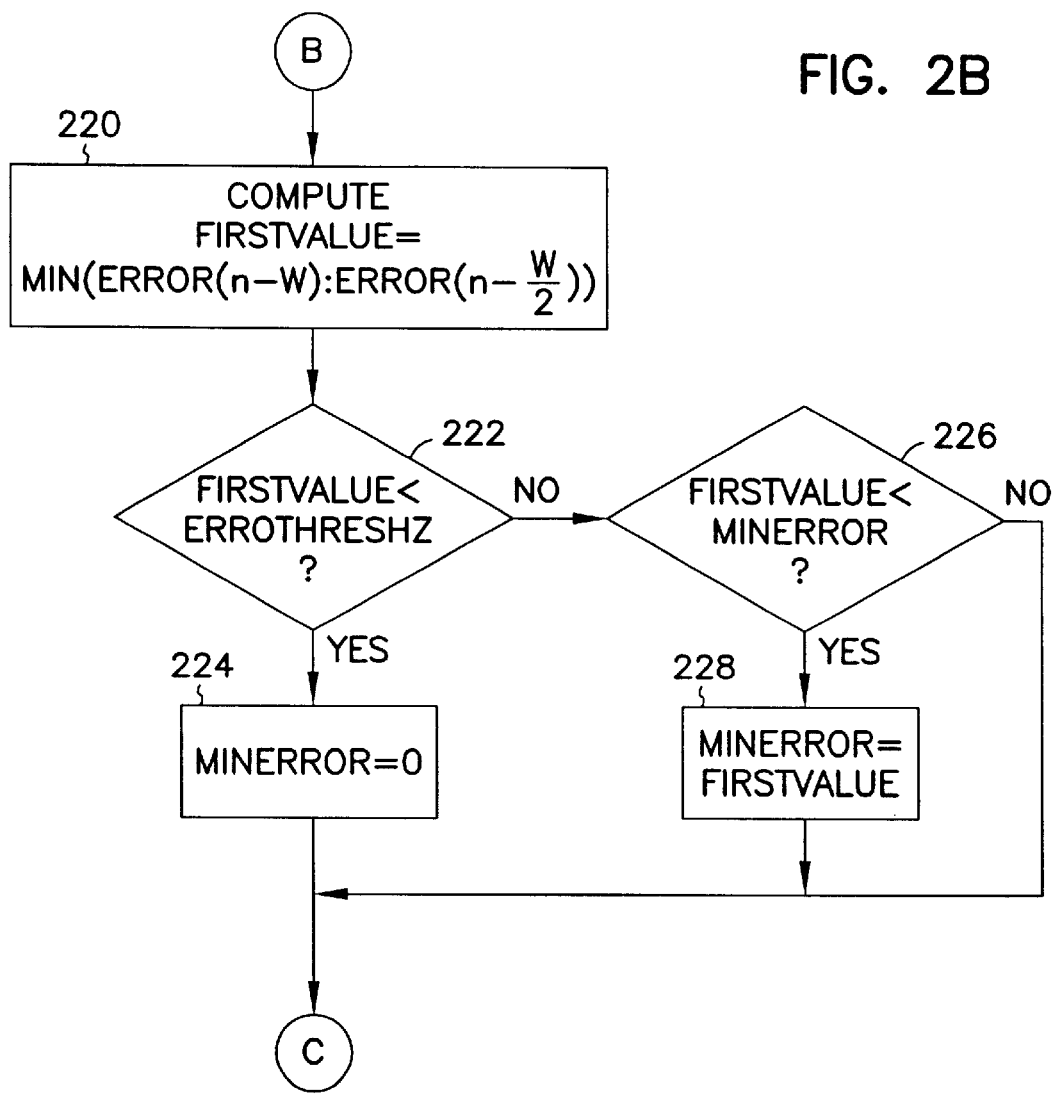
Figure 2C:
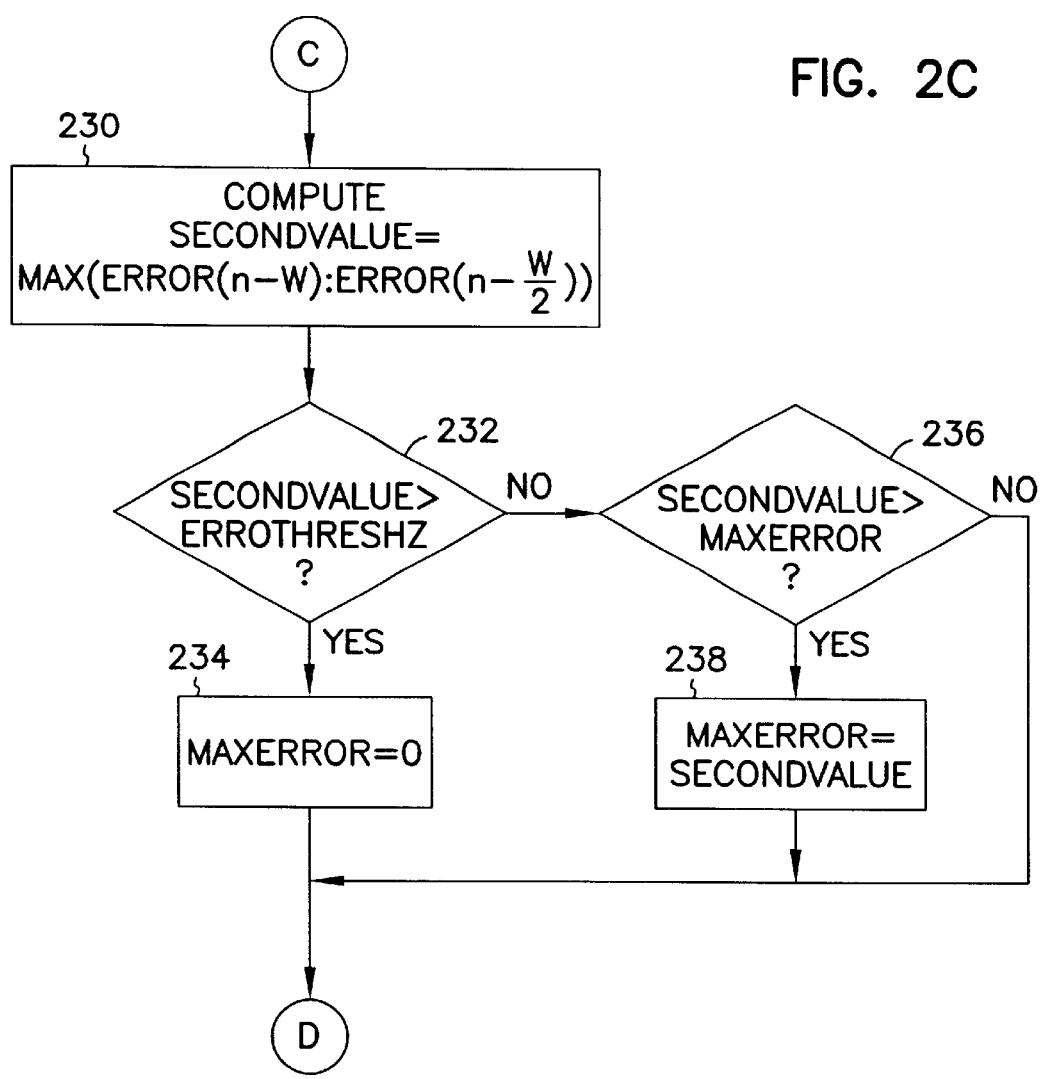
Figure 2D:
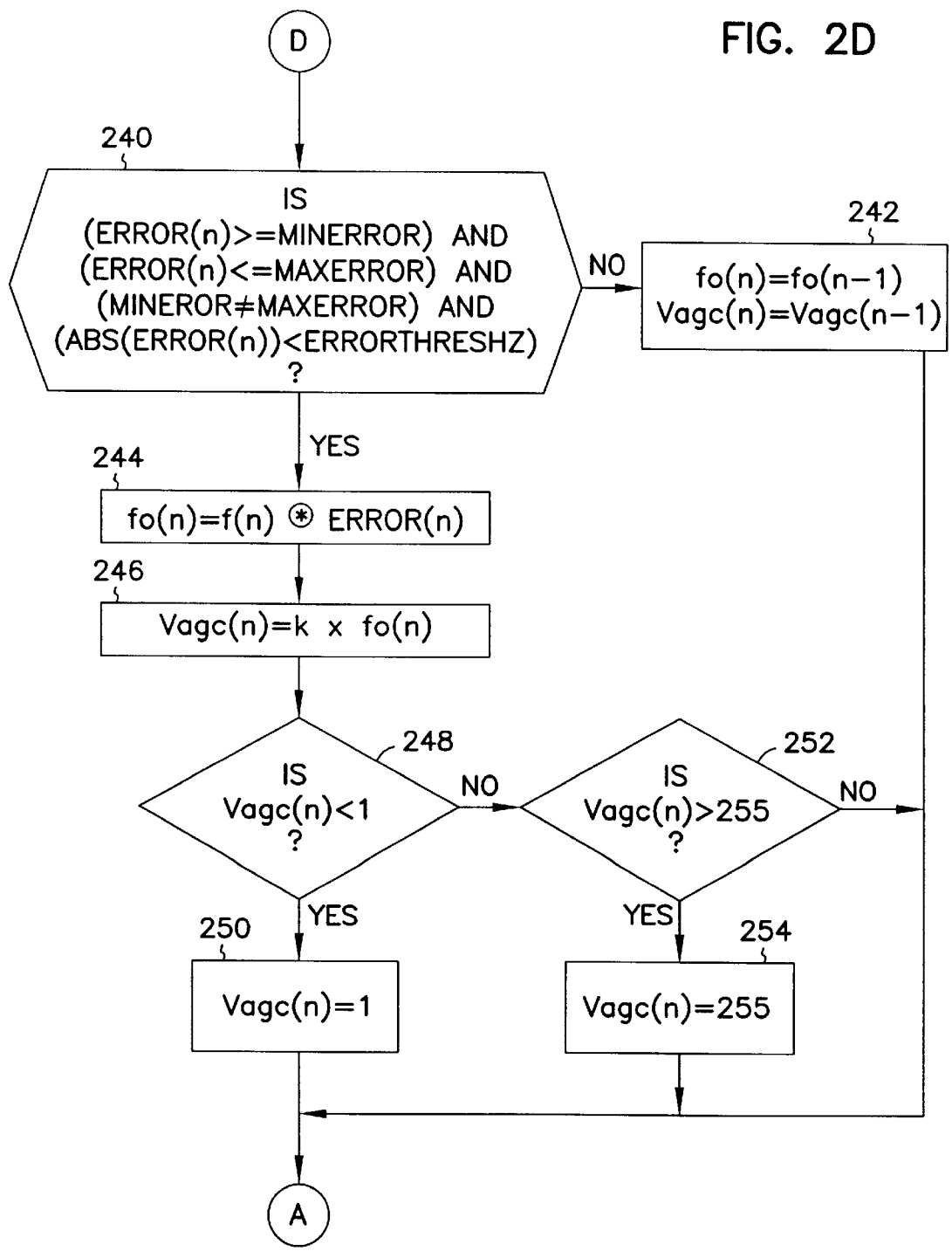

FIGS. 2B, 2C and 2D illustrate one embodiment of a process for determining when the control circuit has reached a state in which its output fluctuates substantially between two values. This state is referred to as the "steady state" of the control circuit. The fluctuation in the output is due to the quantization effect of the digital to analog converter used to control the input to the analog to digital converter. FIG. 2B illustrates one embodiment for a process for detecting a first one of the two values that bound the steady state operation. FIG. 2C illustrates one embodiment of a process for detecting the other of the two values that bound the steady state operation. Finally, FIG. 2D illustrates the application of these two boundaries to the current error signal to determine the appropriate control signal based on whether the control circuit is in steady state or not.

Referring to FIG. 2B, the method first computes a local minimum error value (first value) according to equation 4 at block 220:

$$\text{firstvalue} = \min(\text{error}(n-w):\text{error}(n-w/2)) \qquad \text{Equation 4}$$

In equation 4, the term error(n−w):error(n−w/2) refers to the value of the error signal between time indices n−w and n−w/2, including the time values n−w and n−w/2. At block 222, the method tests the firstvalue (local minimum) against errorthresh (a threshold value). Specifically, the method tests whether the firstvalue is less than−errorthresh. Essentially, the constant errorthresh sets a window such that if the local minimum value falls outside this window, e.g., the local minimum is a negative number and is larger than the constant, then the output of the control circuit is not in the steady state oscillation range. The variable min error is reset to 0 at block 224. If, however, the local minimum error is within the range set by errorthresh, then the output of the control circuit may be in steady state. In this case, the firstvalue is further tested against a constant min error at block 226. If firstvalue is less than the current value of min error, then min error is set to the current firstvalue at block 228. Otherwise, min error is left unchanged.

It is noted that the value used for errorthresh is determined empirically for a given application. The value used is affected by the hardware used, the amount of noise in the system, the resolution of the output digital to analog converter, and other appropriate factors. In one embodiment, when the maximum possible error value is 2048, a value of 100 for errorthresh functioned properly.

Referring to FIG. 2C, the method next computes a local maximum error value (secondvalue) according to equation 5 at block 230:

$$\text{secondvalue} = \max(\text{error}(n-w):\text{error}(n-w/2)) \qquad \text{Equation 5}$$

In equation 5, the term error(n−w):error(n−w/2) again refers to the value of the error signal between time indices n−w and n−w/2, including the time values n−w and n−w/2. At block 232, the method tests the secondvalue (local maximum) against errorthresh. Specifically, the method tests whether the secondvalue is greater than errorthresh. Here, the constant errorthreshz sets the upper limit of the possible steady state window such that if the local maximum value falls outside this window, e.g., the local maximum is positive and larger than the constant, then the output of the control circuit is not in steady state. The variable max error is reset to 0 at block 234. If, however, the local maximum error is within the range set by errorthreshz, then the output of the control circuit may be in steady state. In this case, the secondvalue is further tested against a constant max error at block 236. If secondvalue is less than the current value of max error, then maxerror is set to the current secondvalue at block 238. Otherwise, maxerror is left unchanged.

Referring to FIG. 2D, a determination is made as to whether the control circuit is in steady state based on the current error signal (error(n)), the current values of maxerror and minerror, and the constant errorthreshz. At block 240, the method performs four tests, namely:

1. The current error value is tested to determine if it is greater than or equal to minerror.
2. The current error value is tested to determine if it is less than or equal to the maxerror.
3. The constants maxerror and the minerror are tested to determine whether they are not set to the same value.
4. The absolute value of the current error signal is compared with errorthreshz to determine whether the current error signal falls outside this range.

For steady state to be detected, each of these tests must be positive. The first two tests indicate that the error value falls within a range that could indicate a steady state. The third test indicates that the control circuit has not railed out. The final test indicates that the error level is sufficiently small to be in the steady state. When a steady state condition has been detected, the method proceeds to block 242 and leaves the output of the control circuit at its current value. Otherwise, when the control circuit is not in steady state, a new output is calculated as shown in blocks 244–254.

At block 244, the method convolves the frequency response of the filter $f(n)$ with the current error signal (logerror) as represented by equation 2.

$$f_o(n) = f(n) \otimes \text{error}(n) \qquad \text{Equation 6}$$

This output is multiplied by a constant, K, to produce a control signal, $V_{acg}(n)$ at block 246.

$$V_{acg}(n) = K \times f_0(n) \quad \text{Equation 7}$$

At block 248, the method determines whether the control signal is less than 1. If so, the method substitutes 1 for the control signal and returns to block 202. If not, the method proceeds to block 252 and determines whether the control signal is greater than 255 (the maximum value for the digital to analog converter output of the control loop). If so, the maximum value is substituted at block 254. Otherwise, the method uses the value calculated at block 246 and returns to block 202.

FIG. 3 is a block diagram that illustrates an embodiment of a system that uses automatic gain control for an analog to digital converter according to the teachings of the present invention. In particular, FIG. 3 includes analog input device 302, modulator 304, transmission devices 306 and 308, upconverter 310, radio frequency (RF) combiner 312, optical transmitter 314, optical node 316, line amplifier 318, set-top box 320 and television 322. Analog input device 302 is coupled to modulator 304, which is coupled to transmission device 306. Additionally, transmission device 306 is coupled to transmission device 308 through transmission line 324. In one embodiment, transmission line 324 is a fiberoptic transmission line.

Further, transmission device 308 is coupled to upconverter 310, which is coupled to RF combiner 312. RF combiner 312 is coupled to optical transmitter 314. Moreover, optical transmitter 314 is coupled to optical node 316 through transmission line 326. In one embodiment, transmission line 326 is a fiberoptic transmission line. Optical node 316 is also coupled to line amplifier 318, which, in turn, is coupled to set-topbox 320 that is coupled to television 322.

In operation, analog input device 302 generates an analog video signal which will be viewed by individuals on television 320 after transmission through the system of FIG. 3. In one embodiment, analog input device 302 is a video camera. The analog video signal is then transmitted to modulator 304 where the signal is modulated onto a carrier signal on a transmission line, which is coupled to transmission device 306. Transmission device 306 receives the carrier signal that includes the analog signal.

Using an encoder, transmission device 306 digitizes and formats the analog signal for transmission over transmission line 322. For more information on such an encoder, see copending/cofiled application Ser. No. 09/518,072, attorney docket number 100.129US01, filed on Mar. 2, 2000, entitled "Architecture for Intermediate Frequency Video Encoder" by inventors Dean Painchaud and Lawrence Wachter. This encoder circuit includes at least one analog to digital converter with an automatic gain control circuit of the type described above with respect to FIGS. 1 and 2A, 2B, 2C, and 2D.

After transmission across transmission line 324, transmission device 308 receives the digitized signal and reconstructs an analog signal from this digitized signal that is approximately the same as the original analog signal inputted into transmission device 306, using a decoder as described in copending/cofiled application Ser. No. 09/517,039, attorney docket number 100.130US01, filed on Mar. 2, 2000, entitled "Architecture for Intermediate Frequency Video Decoder" by inventors Dean Painchaud and Lawrence Wachter. Embodiments of such a decoder eliminate the requirement of costly sharp rolloff technology (e.g., SAW filtering) and allow the use of other filtering technology (e.g., LC filtering). Moreover, embodiments of the decoder eliminate the need for expensive digital mixing of the digital signal prior to a D/A conversion of such a signal.

Radio frequency (RF) combiner 312 receives the reconstructed analog signal from transmission device 308 and communicates the signal, as an RF signal, to optical transmitter 314. Optical transmitter 314 transmits this signal along transmission line 326 to optical node 316. Optical node 316 then transmits this signal as an RF signal to line amplifier 318 that amplifies and transmits the signal to set-top box 320 which formats the signal for viewing on television 322. This system illustrates only one signal being transmitted for purposes of illustration and not by way of limitation, as multiple signals can be transmitted in the system of FIG. 3. Moreover, the system of FIG. 3 illustrates the transmission of a signal to a single set-top box and television for purposes of illustration and not by way of limitation, as multiple set-top boxes and televisions or other receiving devices can be used in conjunction with the system of FIG. 3. Further, the system of FIG. 3 illustrates the transmission of a video signal; however, any type of information-bearing signal can be transmitted through the system (e.g., audio and/or data signals).

CONCLUSION

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, the memory device may store any appropriate amount of data. Further, in other embodiments, the memory is omitted and the data processed on the fly from the output to detect a peak value over a period of time. In embodiments of the present invention, the functions of the control circuit are implemented in software, hardware, firmware, or any combination thereof. The number of bits in the signals shown in FIG. 1 can also be varied for specific implementations. Further, other techniques can be used to detect the oscillation of the control signal between two output levels.

What is claimed is:

1. A method for controlling the input to an analog to digital converter, the method comprising:
   monitoring a block of output from the analog to digital converter;
   determining a relative maximum value in the block of output;
   comparing the relative maximum value with a target maximum value to create an error signal;
   comparing the error signal with a threshold value;
   generating a feedback signal based on the error signal;
   when the error signal is less than the threshold value, setting the feedback signal at a first level;
   when the error signal oscillates substantially between first and second values, setting the feedback signal to a selected value; and
   applying the feedback signal to a voltage controlled amplifier to control the amplitude of the input to the analog to digital converter.

2. The method of claim 1, wherein monitoring a block of output comprises capturing and storing a plurality of samples of the output of the analog to digital converter in a memory device.

3. The method of claim 1, wherein monitoring a block of output comprises capturing and storing a contiguous block of samples of the output of the analog to digital converter in a memory device.

4. The method of claim 1, wherein comparing the relative maximum value comprises:
   processing the relative maximum value with a digital log amplifier; and
   comparing the output of the log amplifier with the target maximum value.

5. The method of claim 4, wherein comparing the output of the log amplifier with a target maximum value comprises comparing the output of the log amplifier with a value that is related to approximately ninety-five percent of a full-scale input range of the analog to digital converter.

6. The method of claim 1, and further comprising filtering the error signal with a digital low pass filter.

7. The method of claim 1, and further comprising converting the feedback signal from a digital signal to an analog signal prior to applying the feedback signal to the voltage controlled amplifier.

8. The method of claim 1, wherein comparing the error signal comprises determining when the error signal is a small, negative value.

9. A method for controlling the input to an analog to digital converter, the method comprising:
   monitoring a digital output stream from the analog to digital converter;
   generating a digital feedback signal based on the monitored digital output stream;
   setting the digital feedback signal at a first level when the input to the analog to digital converter is greater than a full-scale input level of the analog to digital converter;
   setting the digital feedback signal to a selected level when an error signal substantially fluctuates between first and second values;
   converting the digital feedback signal to an analog feedback signal; and
   applying the analog feedback signal to a voltage controlled amplifier to adjust the amplitude of the input to the analog to digital converter.

10. The method of claim 9, wherein monitoring a digital output stream comprises capturing and storing a plurality of digital samples in a memory device.

11. The method of claim 9, wherein generating a digital feedback signal comprises:
   determining a relative maximum value in a block of output from the analog to digital converter;
   processing the relative maximum value with a log amplifier;
   comparing the output of a log amplifier with a target maximum value to produce an error signal; and
   filtering the error signal with a digital low pass filter.

12. The method of claim 11, wherein comparing the output of a log amplifier comprises comparing the output a log amplifier with a value that is related to approximately ninety-five percent of a full-scale range of the input of the analog to digital converter.

13. The method of claim 9, wherein setting the digital feedback signal at a first level comprises locking the digital feedback signal at a value that is larger than the value indicated by the generated digital feedback signal.

14. The method of claim 9, wherein generating a digital feedback signal comprises generating a digital feedback signal based on a relative maximum of a plurality of samples from the analog to digital converter over a period of time.

15. The method of claim 9, wherein setting the digital feedback signal to a selected value comprises locking a digital feedback signal to one of first and second values when an error signal oscillates between first and second values.

16. A feedback control circuit for an analog to digital converter, comprising:
   a memory coupled to the output of the analog to digital converter to store a plurality of samples of the output of the analog to digital converter;
   a peak value detector, coupled to the memory, to determine relative peak values in the output of the analog to digital converter;
   a comparator, coupled to the peak value detector, to generate an error signal based on the output of the peak value detector and a target peak value;
   a digital filter, coupled to the comparator, to filter the output of the comparator;
   a fast/slow filter, coupled to the comparator and the digital filter, to set the output of the digital filter when the output of the comparator is below the selected threshold; and
   an oscillation detection circuit, coupled to the comparator and to the digital filter, to set the output of the digital filter to a selected level when the output of the comparator oscillates between first and second values.

17. The feedback control circuit of claim 16, wherein the peak value detector, the comparator, the digital filter, the fast/slow filter, and the oscillation detection circuit are implemented in firmware with a microcontroller.

18. The feedback control circuit of claim 16, and further including a digital to analog converter coupled to the output of the digital filter and providing an input to a voltage controlled amplifier for the input to the analog to digital converter.

19. The feedback control circuit of claim 16, wherein the comparator comprises a log amplifier coupled to the peak value detector and a digital subtractor coupled between the log amplifier and the digital filter.

20. An automatic gain control circuit for an analog to digital converter, the automatic gain control circuit comprising:
   a memory, coupled to an output of the analog to digital converter, to receive and store samples output by the analog to digital converter;
   a digital to analog converter coupled to control a magnitude of an input signal for the analog to digital converter; and
   a microcontroller coupled to the memory and the digital to analog converter for executing code for:
      generating a digital feedback signal based on the output of the analog to digital converter stored in the memory;
      setting the digital feedback signal at a first level when the input to the analog to digital converter is greater than a full-scale input level of the analog to digital converter;
      setting the digital feedback signal to a selected level when an error signal substantially fluctuates between the first and second values; and
      applying the digital feedback signal to the digital to analog converter to adjust the amplitude of the input to the analog to digital converter.

21. The automatic gain control circuit of claim 20, wherein generating a digital feedback signal comprises:
   determining a relative maximum value in a block of output from the analog to digital converter;

processing the relative maximum value with a log amplifier;

comparing the output of a log amplifier with a target maximum value to produce an error signal; and filtering the error signal with a digital low pass filter.

22. The automatic gain control circuit of claim 21, wherein comparing the output of a log amplifier comprises comparing the output of the log amplifier with a value that is related to approximately ninety-five percent of a full-scale range of the input of the analog to digital converter.

23. The automatic gain control circuit of claim 20, wherein setting the digital feedback signal at a first level comprises locking the digital feedback signal at value larger than a value indicated by the digital feedback signal.

24. The automatic gain control circuit of claim 20, wherein generating a digital feedback signal comprises generating a digital feedback signal based on a relative maximum of a plurality of samples from the analog to digital converter over a period of time.

25. The automatic gain control circuit of claim 20, wherein setting the digital feedback signal a selected level comprises locking a digital feedback signal to one of first and second values when an error signal oscillates between first and second values.

26. A computer readable medium containing instructions executable for:

generating a digital feedback signal based on the output of an analog to digital converter;

setting the digital feedback signal at a first level when an input to the analog to digital converter is greater than a full-scale input level of the analog to digital converter;

setting the digital feedback signal to a selected level when an error signal substantially fluctuates between the first and second values; and applying the digital feedback signal to a digital to analog converter to adjust the amplitude of the input to the analog to digital converter.

27. The computer readable medium of claim 26, wherein generating a digital feedback signal comprises:

determining a relative maximum value in a block of output from the analog to digital converter;

processing the relative maximum value with a log amplifier;

comparing the output of a log amplifier with a target maximum value to produce an error signal; and filtering the error signal with a digital low pass filter.

28. The computer readable medium of claim 27, wherein comparing the output of a log amplifier comprises comparing the output a log amplifier with a value that is related to approximately ninety-five percent of a full-scale range of the input of the analog to digital converter.

29. The computer readable medium of claim 26, wherein setting the digital feedback signal at a first level comprises locking the digital feedback signal at value larger than a value indicated by the digital feedback signal.

30. The computer readable medium of claim 26, wherein generating a digital feedback signal comprises generating a digital feedback signal based on a relative maximum of a plurality of samples from the analog to digital converter over a period of time.

31. The computer readable medium of claim 26, wherein setting the digital feedback signal a selected level comprises locking a digital feedback signal to one of first and second values when an error signal oscillates between first and second values.

32. An automatic gain control circuit for an analog to digital converter, the automatic gain control circuit comprising:

an input, coupled to an output of the analog to digital converter, to receive samples output by the analog to digital converter;

a digital to analog converter coupled to selectively adjust a magnitude of an input signal for the analog to digital converter; and a microcontroller, coupled to the input and the digital to analog converter, programmed to generate a feedback signal for the digital to analog converter to control the amplitude of the input to the analog to digital converter.

33. A method for controlling the input to an analog to digital converter, the method comprising:

monitoring a block of digital output from the analog to digital converter;

generating a digital feedback signal based on the monitored output of the analog to digital converter;

adjusting the digital feedback signal when the input to the analog to digital converter is greater than a selected level;

adjusting the digital feedback signal when an error signal substantially fluctuates in a bounded range;

converting the digital feedback signal to an analog feedback signal; and controlling the amplitude of the input to the analog to digital converter with the analog feedback signal.

* * * * *